US008830664B2

(12) United States Patent
Kole et al.

(10) Patent No.: US 8,830,664 B2
(45) Date of Patent: Sep. 9, 2014

(54) COMPLEMENTARY GROUND AND SUPPORT MEMBERS

(75) Inventors: Jared Mitchell Kole, San Jose, CA (US); Charles B. Woodhull, San Francisco, CA (US); Michael Benjamin Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 27 days.

(21) Appl. No.: 13/594,743

(22) Filed: Aug. 24, 2012

(65) Prior Publication Data

US 2014/0055915 A1 Feb. 27, 2014

(51) Int. Cl.
*H05K 5/00* (2006.01)
*H05K 7/00* (2006.01)
*H04M 1/00* (2006.01)
*G11B 17/00* (2006.01)
*G11B 3/70* (2006.01)

(52) U.S. Cl.
USPC ............ 361/679.02; 361/679.09; 361/679.28; 361/679.34; 361/679.43; 455/575.1; 455/575.5; 369/282; 369/253

(58) Field of Classification Search
CPC ..... G06F 1/16; G06F 1/33225; H05K 5/0026; H05K 5/026; H05K 2201/10159

USPC ............ 361/679.01, 679.02, 679.08, 679.09, 361/679.3, 679.55–679.59, 756–759; 455/575.1, 575.3, 575.4, 575.8; 297/391–410

See application file for complete search history.

(56) References Cited

U.S. PATENT DOCUMENTS

| 5,259,767 | A | 11/1993 | Kurbikoff et al. |
| 6,368,154 | B1 | 4/2002 | Hirata et al. |
| 6,500,012 | B1 | 12/2002 | Billenstein et al. |
| 7,442,880 | B2 | 10/2008 | Nasstrom et al. |
| 7,982,290 | B2 | 7/2011 | Chow et al. |
| 2011/0273828 | A1* | 11/2011 | Cochrane ................. 361/679.02 |
| 2013/0105216 | A1* | 5/2013 | Korcz et al. .................... 174/535 |

* cited by examiner

*Primary Examiner* — Jenny L Wagner
*Assistant Examiner* — Jerry Wu
(74) *Attorney, Agent, or Firm* — Womble Carlyle Sandridge & Rice LLP

(57) ABSTRACT

A ground member of a personal electronic device includes a base and a first deflection arm formed of a portion of the base. The first deflection arm exposes a cutout portion of the base and is bent along a first bend line. The cutout portion is dimensioned to engage with a complementary dimensioned support member and the first deflection arm is configured to deflect and engage with the support member in response to insertion of the support member in the cutout portion. The ground member further includes a second deflection arm extending from the base and bent along a second bend line.

19 Claims, 7 Drawing Sheets

COMPLEMENTARY GROUND AND SUPPORT MEMBERS

FIELD OF THE DESCRIBED EMBODIMENTS

The described embodiments relate generally to personal electronic devices, and more particularly, to support members in personal electronic devices that provide mechanical support and access to ground or common.

BACKGROUND

Conventionally, personal electronic devices include a plurality of electrical components disposed within a housing. The housing may be formed of metal or a metal alloy, and may provide a ground or common connection for the components disposed therein (e.g., for shielding, antenna, or other components). Furthermore, the housing may include a plurality of tapped or drilled holes allowing for electrical connection to ground through the use of a complementary screw or bolt. Oftentimes, the screw or bolt may provide partial mechanical support including fastening of a component against a wall or surface of the housing. Further mechanical support may be provided with additional fasteners or adhesive.

However, as overall sizes of housings are minimized to reduce overall dimensions of personal electronic devices, access to sufficient thickness of housing material to provide an appropriate fastening force through the use of holes and fasteners becomes problematic. Furthermore, overuse or application of adhesives may hinder good electrical contact with ground. For example, as thicknesses of housing material are minimized, it may become impossible to apply any standard threading to a hole which allows engaging with the hole, appropriate fastening force, and good electrical contact to ground.

Therefore, what is needed is innovation in device housings which do not directly depend on minimum housing thickness to provide good mechanical support and contact with ground.

SUMMARY OF THE DESCRIBED EMBODIMENTS

This paper describes various embodiments that relate to personal electronic devices and associated housings.

According to one embodiment of the present invention, a ground member of a personal electronic device includes a base and a first deflection arm formed of a portion of the base. The first deflection arm exposes a cutout portion of the base and is bent along a first bend line. The cutout portion is dimensioned to engage with a complementary dimensioned support member and the first deflection arm is configured to deflect and engage with the support member in response to insertion of the support member in the cutout portion. The ground member further includes a second deflection arm extending from the base and bent along a second bend line.

According to an additional embodiment of the present invention, a ground and support connection of a personal electronic device includes a ground member and a support member. The ground member includes a base, a first deflection arm formed of a portion of the base exposing a cutout portion of the base and being bent along a first bend line, and a second deflection arm extending from the base and bent along a second bend line. The support member is formed from a housing of the personal electronic device. The cutout portion of the ground member is dimensioned to engage with the support member, and furthermore, the first deflection arm is configured to deflect and engage with the support member in response to insertion of the support member in the cutout portion.

According to an additional embodiment of the present invention, a method of forming and assembling a ground and support connection for a personal electronic device housing includes forming a support member within the personal electronic device housing and inserting a ground member onto the support member. The ground member includes a base and a first deflection arm formed of a portion of the base exposing a cutout portion of the base and being bent along a first bend line. The cutout portion is dimensioned to engage the support member and the first deflection arm is configured to deflect and engage with the support member in response to inserting the ground member onto the base. The ground member further includes a second deflection arm extending from the base and bent along a second bend line.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

Various aspects of this disclosure may be better understood upon reading the following detailed description and upon reference to the drawings in which.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

As provided herein, various embodiments directed to combination ground and support members comprising at least a ground member and a support member integrally formed of a device housing are described in detail. The ground member may include a deflectable arm configured to engage and partially embed in the support member. The engaging and partial embedding ensures a stable electrical connection therebetween while also resisting disengaging from the support member. The ground member may further include a second deflectable arm arranged as a spring to bias electrical components of a personal electronic device and connect a portion thereof to ground or common. The support member may include a substantially rectangular cross section affording easy installation and X-Y alignment of the ground member.

Figure 1:
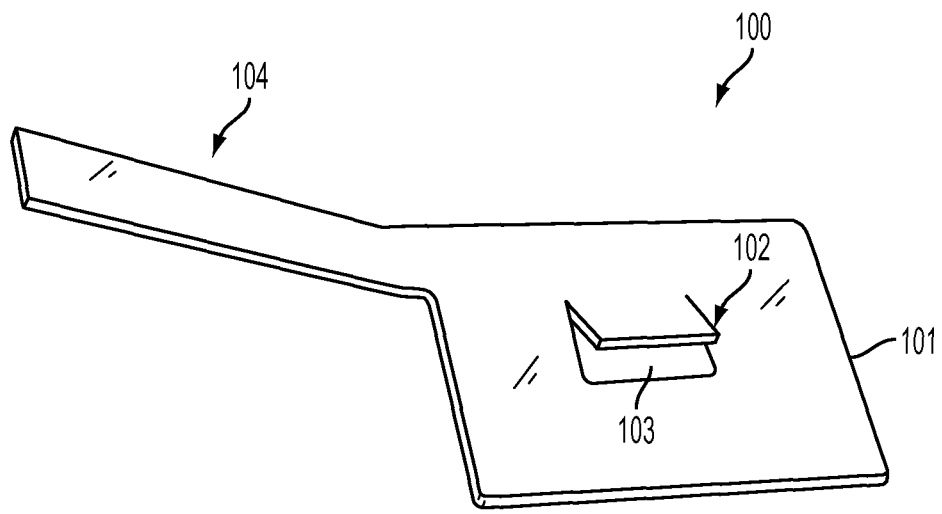
FIG. 1 is a perspective view of a ground member of a personal electronic device, according to an embodiment of the present invention.

Turning to FIG. 1, a perspective view of a ground member 100 of a personal electronic device is illustrated, according to an embodiment of the present invention. As shown, the ground member 100 includes a base 101, a first deflectable arm 102, and a second deflectable arm 104. The first deflectable arm 102 is formed from and exposes a cutout 103 of the base 101, and may be additionally trimmed or milled such that spacing between the arm 102 and cutout 103 leaves a gap for entry of a support member as described herein. The ground member 101 may be formed of metal or a metal alloy, such as for example, stainless steel, titanium, titanium alloys, hardened aluminum allows, or any other suitable material. The cutout 103 may be dimensioned to receive a complementary dimensioned support member described below.

Figure 2:
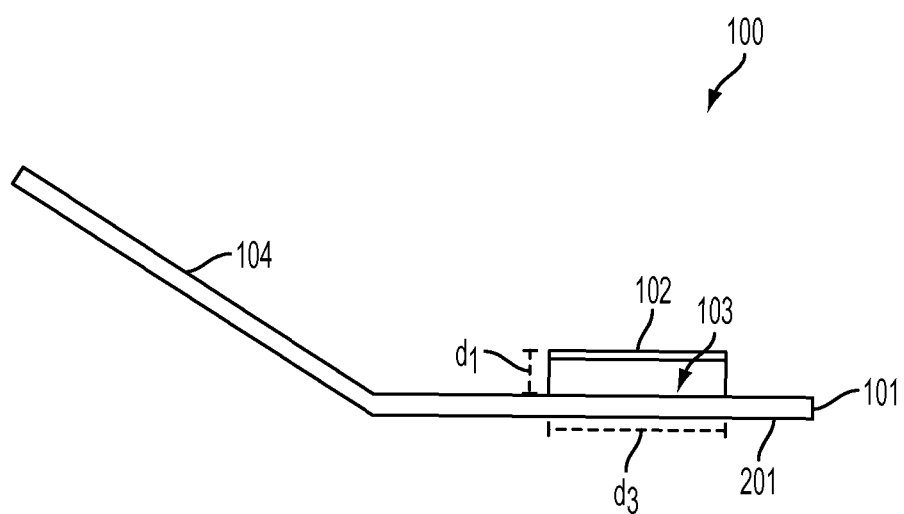
FIG. 2 is a side elevation view of the ground member of FIG. 1.

Turning to FIG. 2 is a side elevation view of the ground member 100 is provided. As shown, the first deflectable arm 102 at rest rises a maximum distance $d_1$ from an upper surface 201 of the base 101.

Figure 3:
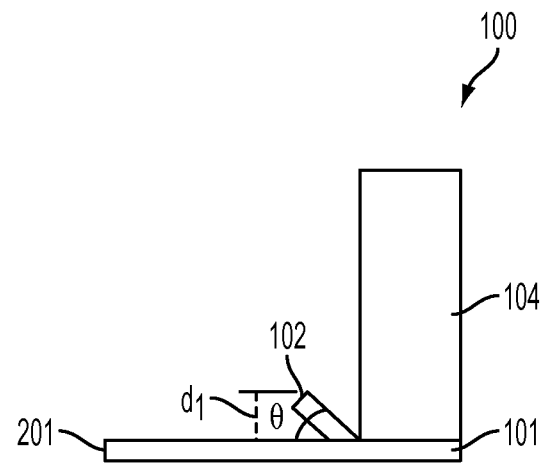
FIG. 3 is a frontal elevation view of the ground member of FIG. 1.

Turning to FIG. 3 a frontal elevation view of the ground member 100 is provided. As shown, the first deflectable arm 102 is at rest arranged at a deflection angle ⊖ measured from the upper surface 201 of the base 101. The angle ⊖ may increase during deflection of the arm 102, for example, if engaging a support member as described herein. Furthermore, spring force provided by the material forming member 101 resisting deflection may promote firm electrical contact with a support member.

Figure 4:
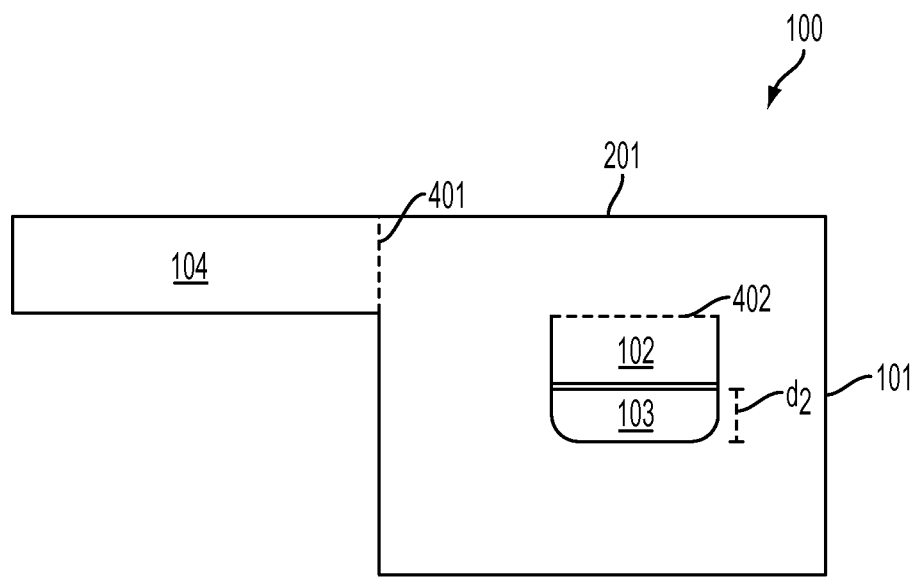
FIG. 4 is an overhead view of the ground member of FIG. 1.

Turning to FIG. 4, an overhead view of the ground member 100 is provided. As shown, the first deflectable arm 102 is formed from cutout 103 and bent along a first bend line 402. The bend line 402 intersects an origin of the deflection angle ⊖. Therefore, a lateral initial deflection distance $d_2$ may decrease as the deflection angle ⊖ decreases, and the lateral deflection distance $d_2$ may increase as the deflection angle ⊖ increases. As such, insertion and engagement of a support member may deflect the arm 102 along bend line 402 such that the lateral deflection distance $d_2$ increases to substantially the lateral dimension of the support member.

As further shown, the second deflectable arm 104 is bent along a second bend line 401. The bending of the second deflectable arm 104 allows for a spring-like actuation of the arm 104, thereby allowing support and ground connection of an electronic component in contact therewith.

Hereinafter, support members of housings of personal electronic devices are described in detail with reference to FIGS. 5-8.

Figure 5:
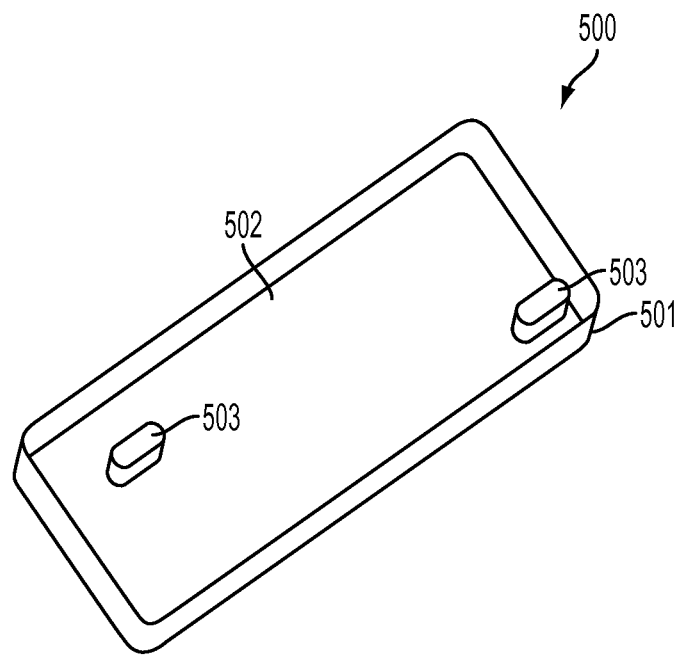
FIG. 5 is a perspective view of a personal electronic device housing having a plurality of support members formed therein, according to an embodiment of the present invention.

FIG. 5 is a perspective view of a personal electronic device housing 500 having a plurality of support members 503 formed therein, according to an embodiment of the present invention. As illustrated, the housing 500 includes a side wall 501 and base wall 502. The housing 500 further includes one or more support members 503 arranged on the base wall 502. The side wall 501, base wall 502, and support members 503 may be formed through the milling or processing of a single block of material such as, for example, a block of aluminum, aluminum alloy, stainless steel, titanium, or other suitable material. The single block of material may be milled in any suitable tool or machining process, including automated manufacturing processes. As such, each support member 503 may comprise un-milled or partially milled material integrally attached to the base wall 502. The housing 500 may include a plurality of additional milled features not illustrated for clarity of discussion, and therefore, embodiments of the present invention should not be limited to the particular dimensions, shape, or form of FIG. 5, but rather should be interpreted to include all equivalent structures allowing for inclusion of one or more support members 503.

Figure 6:
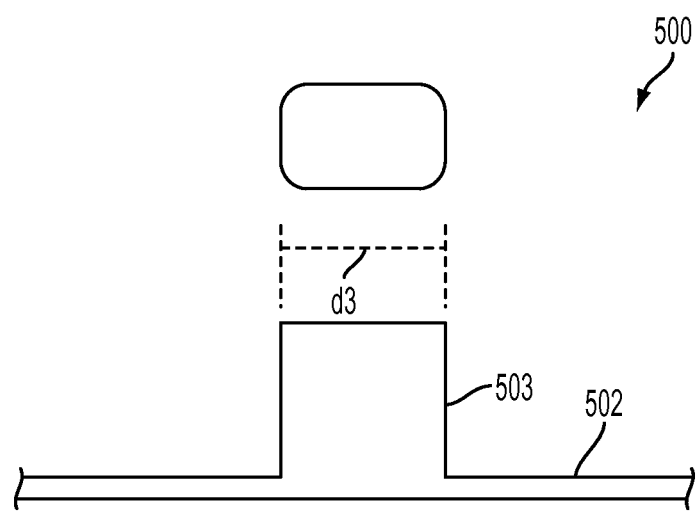
FIG. 6 is a side elevation view of a support member of the housing of FIG. 5.

Turning to FIG. 6, a side elevation view of support member 503 is provided. As shown, the support member 503 is a substantially solid member integrally arranged on the base wall 502. Therefore, there may be a good electrical connection between surfaces of the support member 503 and the base wall 502. As such, if the base wall 502 or entire housing 500 is used as a common return path for electrical components housed therein, contact with surfaces of the support member 503 may allow access to said return path. As further shown, the support member 503 includes a longitudinal dimension $d_3$. The longitudinal dimension $d_3$ may be sized to relate to a longitudinal dimension of the cutout 103 such that engagement therewith provides stable X-Y alignment.

Figure 7:
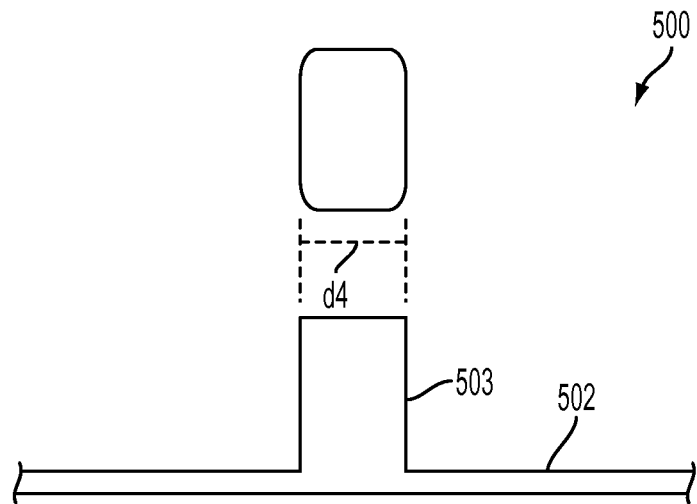
FIG. 7 is a frontal elevation view of a support member of the housing of FIG. 5.

Turning to FIG. 7, a frontal elevation view of support member 503 is illustrated. As shown, the support member 503 includes a lateral dimension $d_4$. The lateral dimension $d_4$ may be sized to deflect the first deflection arm 102 sufficiently to allow for good electrical contact between the support member 503 and the arm 102. Furthermore, the lateral dimension $d_4$ may be sized to deflect the first deflection arm 102 sufficiently to allow a portion thereof, or at least a point or edge thereof, to embed within an outer surface of the support member 503. In this manner, stable fastening of the member 100 may be achieved.

Figure 8:
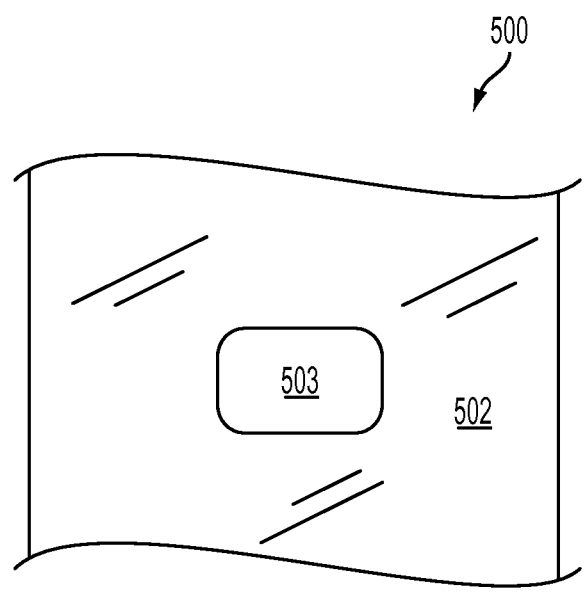
FIG. 8 is an overhead view of a support member of the housing of FIG. 5.

FIG. 8 is an overhead view of support member 503, and depicts the substantially rectangular cross section of the same.

Hereinafter, engaging of a ground member 100 and support member 503 are described in detail with reference to FIGS. 9-12.

Figure 9:
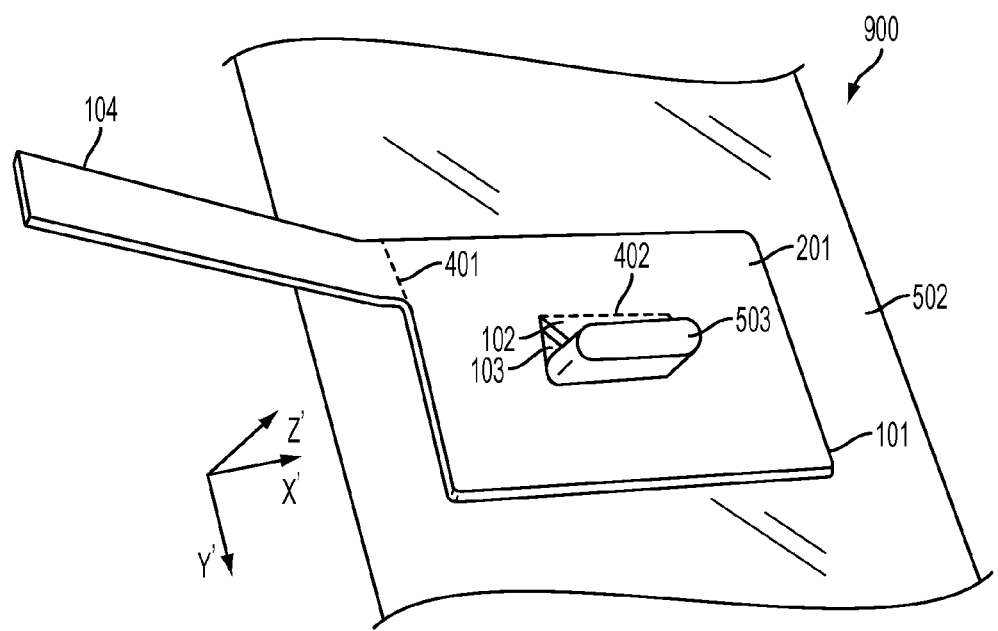
FIG. 9 is a perspective view of an assembled ground and support connection, according to an embodiment of the invention.

FIG. 9 is a perspective view of an assembled ground and support connection 900, according to an embodiment of the invention. As shown, the first deflection arm 102 is deflected along bend line 402 and engaged with an exterior surface of the support member 503. Furthermore, base 101 is in contact with base wall 502 of the housing 500. Moreover, deflection arm 104 is configured to deflect along axis Z' and bend line 401 without disturbing the X'-Y' alignment of the member 100 and housing 500.

Figure 10:
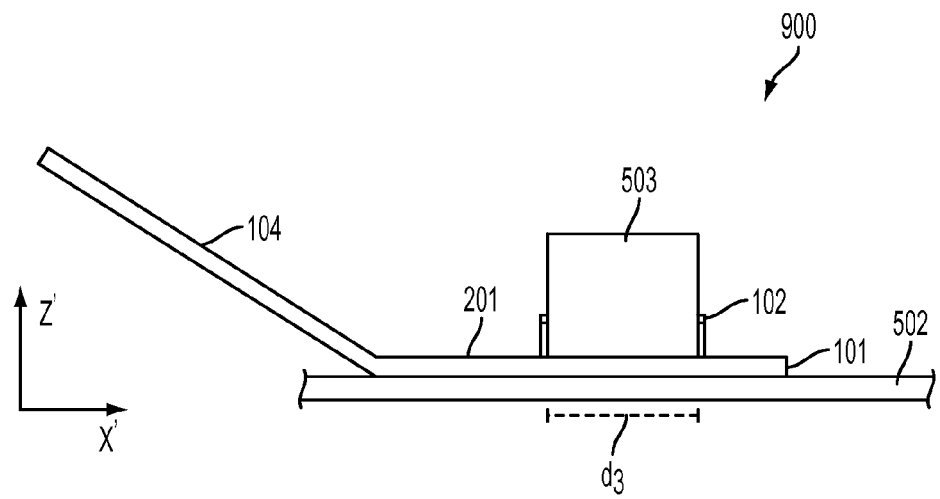
FIG. 10 is a side elevation view of the assembled ground and support connection of FIG. 9.

FIG. 10 is a side elevation view of the assembled ground and support connection 900. As shown, base 101 is in contact with base wall 502 of the housing 500. Furthermore, deflection arm 104 is configured to deflect along axis Z' without disturbing the X' positioning of the member 100 and housing 500.

Figure 11:
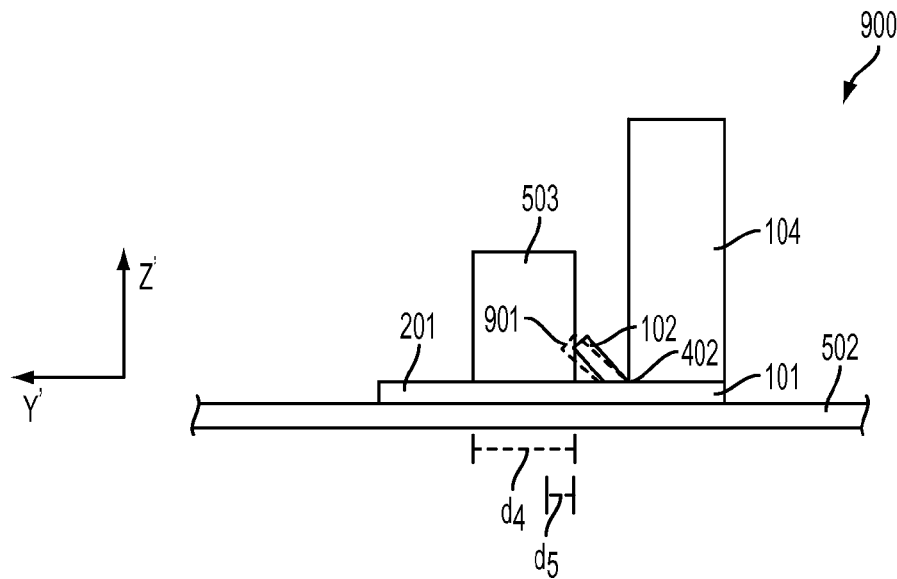
FIG. 11 is a frontal elevation view of the assembled ground and support connection of FIG. 9.

FIG. 11 is a frontal elevation view of the assembled ground and support 900. As shown, the first deflection arm 102 is deflected along bend line 402 and engaged with an exterior surface of the support member 503 at line 901. Line 901 may include both an edge of the deflection arm 102 and a portion of the exterior surface of the support member 503. Furthermore, the deflection distance $d_5$ of the deflection arm 102 is approximately the difference between the initial rest dimension $d_2$ of the deflection arm 102 and the lateral dimension $d_4$ of the support member 503. As such, Y' positioning of the member 100 and housing 500 is maintained.

Although illustrated as having a substantially smooth outer surface, it should be understood that the support member 503 may be milled to include a groove or other engagement indentation at or near the line 901 to promote greater retention of the member 100. For example, the groove or indentation may allow the deflection arm 102 to snap into place. All such modifications are considered to be within the scope of embodiments of the invention.

Figure 12:
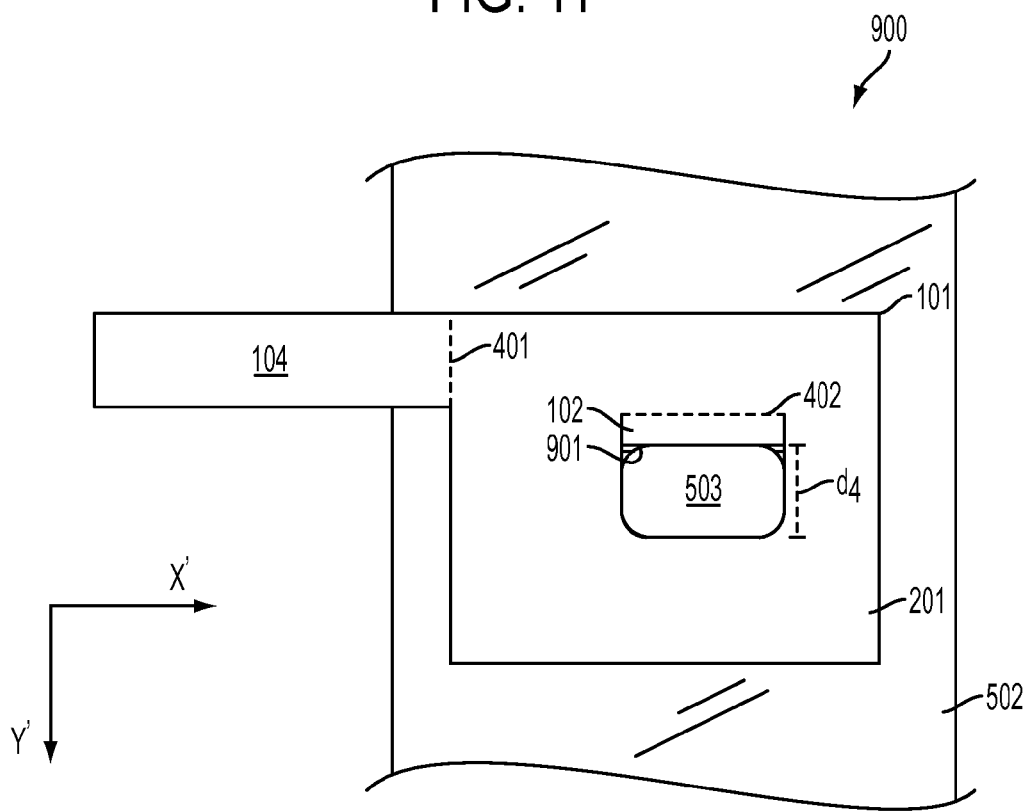
FIG. 12 is an overhead view of the assembled ground and support connection of FIG. 9.

FIG. 12 is an overhead view of the assembled ground and support connection 900. As shown, X'-Y' alignment of the member 100 and housing 500 is maintained upon assembly.

It is noted that as deflection arm 104 is configured to deflect along a Z' axis, electrical components may be populated against the deflection arm 104 and thereby garner an electrical connection to ground and support through biasing or spring forces provided by arm 104. Furthermore, according to at least one embodiment of the invention, the entire member 100 is formed of a relatively harder material than the housing, and therefore the support member 503, and as such engagement and deflection of the arm 102 may cause a "biting" or gripping action which resists removal of the member 100 upon assembly of the connection 900. According to one embodiment, the member 100 is formed of stainless steel while the housing 500 is formed of aluminum or an aluminum alloy to facilitate these features. Other materials may also be used without departing from the scope of embodiments as described herein.

Hereinafter, assembly of the connection 900 is described in detail with reference to FIG. 13.

Figure 13:
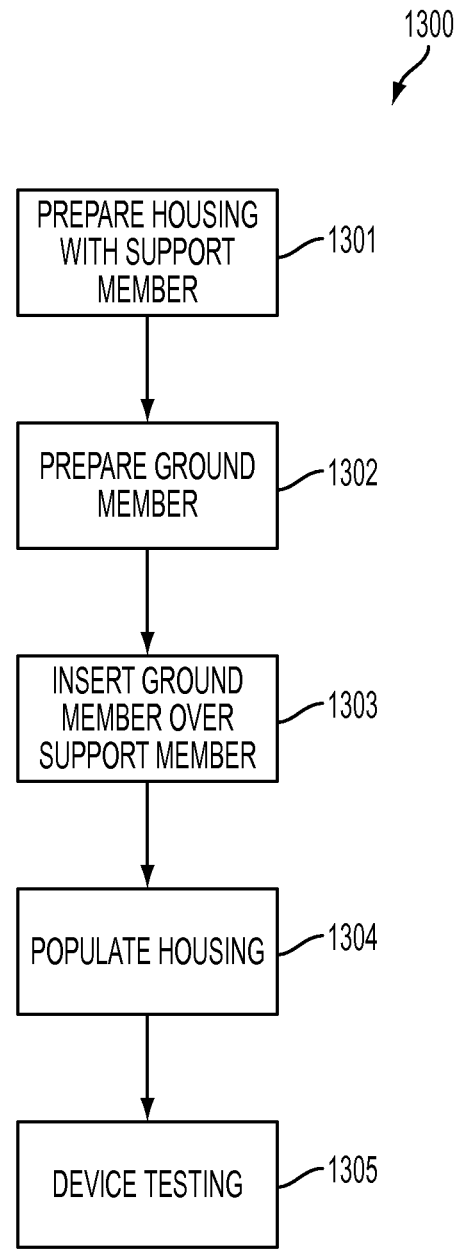
FIG. 13 is a flowchart of a method of forming and assembling a ground and support connection, according to an embodiment of the present invention.

FIG. 13 is a flowchart of a method of forming and assembling a ground and support connection, according to an embodiment of the present invention. The method 1300 includes preparing a device housing with at least one support member at block 1301. The at least one support member may be substantially similar to support member 503, and may be termed a boss or other structural equivalent. The device housing may be similar to housing 500, or may differ according to any desired implementation.

The method 1300 further includes preparing a ground member at block 1302. The ground member may be substantially similar to ground member 100, and may include at least one deflection arm configured to engage with the support member.

The method 1300 further includes inserting the ground member over the support member at block 1303. Inserting may include aligning a cutout (e.g., cutout 103) over the support member (e.g., 503) and forcefully pushing the ground member against the support member until a stable connection is made. For example, a base of the ground member may be pushed to be in contact with a base wall of the prepared housing, and the at least one deflection arm of the ground member may engage and grip the support member.

The method 1300 further include populating the device housing at block 1304 and device testing at block 1305. For example, populating the housing may include aligning and inserting at least one electrical component to be in contact with a second deflection arm of the ground member. The second deflection arm may provide a biasing or spring force to ensure electrical contact through the ground member and to the support member, which may provide a common return path for electrical components populating the device housing.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing or assembly line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A personal electronic device, comprising:
 a grounding member, comprising:
  a base,
  a first deflection arm formed of a portion of the base and bent along a first bend line such that a cutout portion of the base is exposed and the first deflection extends from a single side of the cutout portion, and
  a second deflection arm extending from the base and bent along a second bend line; and
 a support member comprising a protrusion extending from and integrally formed with an interior surface of a housing of the personal electronic device, the support member being disposed through the cutout portion of the base,
 wherein a distal end of the first deflection arm is embedded within a lateral surface of the protrusion, thereby preventing the grounding member from being disengaged from the support member, and wherein the second defection arm is in direct contact with an electrical component disposed within the housing, thereby creating an electrically conductive pathway between the electrical component and the housing.

2. The personal electronic device of claim 1, wherein the second deflection arm is substantially longer than the first deflection arm.

3. The personal electronic device of claim 1, wherein the cutout portion of the base is substantially rectangular and wherein the first deflection arm extends from one side of the cutout portion.

4. The personal electronic device of claim 1, wherein the protrusion comprises a lateral surface defining a groove having a size and shape in accordance with the distal end of the first deflection arm, the groove allowing the first deflection arm to snap into place when the grounding spring is installed upon the protrusion.

5. The personal electronic device of claim 1, wherein a substantially rectangular cross section of the support member facilitates alignment of the grounding spring within the cavity and resists rotation of the ground member in relation to the support member.

6. The personal electronic device of claim 1, wherein the second deflection arm of the ground member is configured to provide access to a common electrical return path for an electrical component in contact therewith.

7. The personal electronic device of claim 1, further comprising:
   a plurality of grounding members, each grounding member comprising a base, a first deflection arm formed of a portion of the base exposing a cutout portion of the base and being bent along a first bend line, and a second deflection arm extending from the base and bent along a second bend line; and
   a plurality of support members formed from the housing configured to engage with respective cutout portions of the plurality of ground members.

8. An electronic device, comprising:
   a housing, comprising a plurality of walls that define a cavity, and a support feature comprising a protrusion integrally formed with and extending from an interior surface of a select one of the walls;
   an electrical component disposed within the cavity of the housing; and
   a grounding spring, comprising:
      a metal substrate defining an opening through which the protrusion extends,
      a first deflection arm integrally formed with and extending from one side of the opening, the first deflection arm being bent along a first bend line defined by an intersection of the first deflection arm and the one side of the opening, wherein a distal end of the first deflection arm is embedded into a lateral surface of the protrusion; and
      a second deflection arm extending from one end of the base and bent along a second bend line so that the second deflection arm extends away from the wall, the second deflection arm in direct contact with the electrical component and operative to ground the electrical component to the wall of the housing.

9. The electronic device of claim 8, wherein the grounding spring is formed of a harder material than material utilized to form the protrusion.

10. The electronic device of claim 8, wherein the protrusion further comprises a groove having a size and shape in accordance with the distal end of the first deflection arm that allows the first deflection arm to be deeply embedded within the protrusion.

11. The electronic device of claim 8, wherein a cross-sectional shape of the protrusion and a shape of the opening are both substantially rectangular and complementary to one another.

12. The electronic device of claim 8, wherein a deflection angle of the first deflection arm with respect to the metal substrate is an acute angle.

13. The electronic device of claim 8, wherein the first deflection arm is substantially shorter than the second deflection arm.

14. The electronic device of claim 8, wherein edges of the metal substrate that define the opening through which the protrusion is disposed cooperate with a shape of the protrusion to prevent the grounding spring from rotating around the protrusion.

15. The electronic device of claim 8, wherein the metal substrate is positioned substantially parallel to the wall from which the protrusion extends.

16. A portable electronic device, comprising:
   a housing, comprising a plurality of walls that define a internal volume, and a support feature comprising a protrusion integrally formed with and extending from a surface of a select one of the walls and into the internal volume;
   an electrical component disposed within the internal volume; and
   a grounding spring, comprising:
      an electrically conductive base defining an opening through which the protrusion extends,
      a first deflection arm integrally formed with and extending from one side of the opening, the first deflection arm being bent along a first bend line defined by an intersection of the first deflection arm and the one side of the opening, wherein a distal end of the first deflection arm is disposed within a groove defined by a lateral surface of the protrusion; and
      a second deflection arm extending from one end of the base and bent along a second bend line so that the second deflection arm extends away from the wall, the second deflection arm in direct contact with the electrical component and operative to ground the electrical component to the wall of the housing.

17. The portable electronic device as recited in claim 16, wherein the grounding spring is formed from a single sheet of metal.

18. The portable electronic device as recited in claim 16, wherein the first deflection arm extends from the electrically conductive base at an acute angle.

19. The portable electronic device as recited in claim 18, wherein the first deflection arm cooperates with the groove to resist removal of the grounding spring from the protrusion.

* * * * *

UNITED STATES PATENT AND TRADEMARK OFFICE
CERTIFICATE OF CORRECTION

PATENT NO. : 8,830,664 B2  
APPLICATION NO. : 13/594743  
DATED : September 9, 2014  
INVENTOR(S) : Charles B. Woodhull et al.

Page 1 of 1

It is certified that error appears in the above-identified patent and that said Letters Patent is hereby corrected as shown below:

In the Claims:

Column 7, line 12 (Claim 4, line 5): "grounding spring" should read --grounding member--.

Column 7, line 16 (Claim 5, line 3): "grounding spring" should read --grounding member--.

Column 7, line 17 (Claim 5, line 4): "ground member" should read --grounding member--.

Signed and Sealed this
Thirteenth Day of January, 2015

Michelle K. Lee
*Deputy Director of the United States Patent and Trademark Office*